United States Patent
Ando et al.

(10) Patent No.: US 10,101,220 B2
(45) Date of Patent: Oct. 16, 2018

(54) DISPLACEMENT DETECTION SENSOR AND OPERATION INPUT DEVICE

(71) Applicant: Murata Manufacturing Co., Ltd., Nagaokakyo-shi, Kyoto-fu (JP)

(72) Inventors: Masamichi Ando, Nagaokakyo (JP); Hideki Kawamura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 573 days.

(21) Appl. No.: 14/707,183

(22) Filed: May 8, 2015

(65) Prior Publication Data

US 2015/0247765 A1 Sep. 3, 2015

Related U.S. Application Data

(63) Continuation of application No. PCT/JP2014/050495, filed on Jan. 15, 2014.

(30) Foreign Application Priority Data

Jan. 18, 2013 (JP) .................................. 2013-006845

(51) Int. Cl.
*G01L 1/16* (2006.01)
*G06F 3/041* (2006.01)
(Continued)

(52) U.S. Cl.
CPC .............. *G01L 1/16* (2013.01); *G06F 3/0414* (2013.01); *H01L 41/1132* (2013.01); *H01L 41/193* (2013.01)

(58) Field of Classification Search
CPC ..... G01L 1/16; G06F 3/0414; G06F 3/03547; G06F 3/041; H01L 41/1132; H01L 41/193

(Continued)

(56) References Cited

U.S. PATENT DOCUMENTS 5,959,209 A * 9/1999 Takeuchi .................. G01L 1/16
    73/514.34
8,284,567 B2 * 10/2012 Park ........................ H04M 1/23
    310/317

(Continued)

FOREIGN PATENT DOCUMENTS

CN 102460351 A 5/2012
CN 102822779 A 12/2012
(Continued)

OTHER PUBLICATIONS

International Search Report issued for PCT/JP2014/050495, dated Apr. 15, 2014.

(Continued)

*Primary Examiner* — Bryan Gordon
(74) *Attorney, Agent, or Firm* — Arent Fox LLP (57) ABSTRACT

A displacement detection sensor has a plate member and piezoelectric sensors with a piezoelectric film of PLLA. The piezoelectric sensors are mounted on the face of the plate member on the opposite side of the operation surface thereof. Tensile stresses are generated in the entire face of the plate member at pressing the operation surface. The piezoelectric sensor is mounted so that the direction of macro tensile stress in the plate member in the region in which the piezoelectric sensor is mounted and molecular orientation direction of the piezoelectric film intersect each other at an angle of 45°. The piezoelectric sensor is mounted so that the direction of macro tensile stress in the plate member in the region in which the piezoelectric sensor is mounted and molecular orientation direction of the piezoelectric film intersect each other at an angle of approximately 45°.

20 Claims, 7 Drawing Sheets

(51) Int. Cl.
*H01L 41/113* (2006.01)
*H01L 41/193* (2006.01)

(58) Field of Classification Search
USPC .............................. 310/323.21, 328; 345/173
See application file for complete search history.

(56) References Cited

U.S. PATENT DOCUMENTS

| | | | |
|---|---|---|---|
| 9,200,970 B2 | 12/2015 | Kodani et al. | |
| 9,383,884 B2 | 7/2016 | Ando | |
| 2005/0134574 A1* | 6/2005 | Hill | G06F 3/041 |
| | | | 345/173 |
| 2012/0249459 A1* | 10/2012 | Sashida | G06F 3/016 |
| | | | 345/173 |
| 2013/0027339 A1* | 1/2013 | Kodani | G01L 1/16 |
| | | | 345/173 |
| 2013/0082970 A1* | 4/2013 | Frey | G06F 3/0414 |
| | | | 345/173 |
| 2013/0328817 A1* | 12/2013 | Andoh | G06F 3/046 |
| | | | 345/173 |
| 2014/0049137 A1* | 2/2014 | Ando | G01B 7/16 |
| | | | 310/330 |
| 2016/0154514 A1* | 6/2016 | Kawamura | G06F 3/0414 |
| | | | 345/174 |

FOREIGN PATENT DOCUMENTS

| | | |
|---|---|---|
| JP | H05-61592 A | 3/1993 |
| JP | 2006-163618 A | 6/2006 |
| WO | WO 2010/143528 A1 | 12/2010 |
| WO | WO 2011/125389 A1 | 10/2011 |
| WO | WO 2012-137897 A1 | 10/2012 |

OTHER PUBLICATIONS

Written Opinion of the International Searching Authority issued for PCT/JP2014/050495, dated Apr. 15, 2014.

* cited by examiner

DISPLACEMENT DETECTION SENSOR AND OPERATION INPUT DEVICE

CROSS-REFERENCE TO RELATED APPLICATIONS

The present application is a continuation of PCT/JP2014/050495 filed Jan. 15, 2014, which claims priority to Japanese Patent Application No. 2013-006845, filed Jan. 18, 2013, the entire contents of each of which are incorporated herein by reference.

FIELD OF THE INVENTION

The present invention relates to a displacement detection sensor and an operation input device, which detect displacement at pressing an operation surface.

BACKGROUND OF THE INVENTION

Various operation detection sensors which detect an operation onto an operation surface by the operator have been contrived. Although the operation detection sensors are of the electrostatic capacity type, the thermal resistance type, the piezoelectric acoustic type, and the infrared sensor type, it is necessary to mount a different displacement detection sensor for detecting the amount of displacement orthogonal to the operation surface at pressing the operation surface.

Patent Literature 1 describes a touch input device having a touch panel as an operation detection sensor, and a pressure-sensitive sensor detecting pressing onto an operation surface. In the touch input device of Patent Literature 1, the pressure-sensitive sensor is arranged on the lower face of the touch panel (the face on the opposite side of the operation surface), and has the same area as the touch panel. In addition, in the touch input device of Patent Literature 1, a protective layer is arranged on the touch panel on the operation surface side.

Patent Literature 2 describes an operation input device in which electrodes in a matrix are formed on both faces of a planar piezoelectric substance.

Patent Literature 1: Japanese Patent Application Laid-Open (JP-A) No. H5-61592

Patent Literature 2: Japanese Patent Application Laid-Open (JP-A) No. 2006-163618

However, in the structures of the conventional techniques, the following problems arise.

In the touch input device described in Patent Literature 1, the pressure-sensitive sensor senses pressing onto the operation surface by the operator through the protective film and the touch panel. Consequently, the pressing detection sensitivity is low. Further, when the touch input device is mounted in a mobile terminal, the member having predetermined rigidity and made of glass is typically mounted on the operation surface. In this case, the pressing detection sensitivity lowers.

In the operation input device described in Patent Literature 2, the linear electrodes in a matrix detect electric charge generated by pressing, with the result that the pressing detection sensitivity is low. Further, when the operation input device is mounted in a mobile terminal, the member having predetermined rigidity and made of glass is typically mounted on the operation surface. In this case, like the operation input device described in Patent Literature 1, the pressing detection sensitivity lowers.

SUMMARY OF THE INVENTION

Accordingly, an object of the present invention is to provide a displacement detection sensor and an operation input device, which have high pressing detection sensitivity.

A displacement detection sensor of the present invention includes a plate member in which one principal plane is an operation surface, and a flat-film piezoelectric sensor mounted on the other principal plane of the plate member and including a flat piezoelectric film and detection electrodes formed on both principal planes of the piezoelectric film. The piezoelectric film contains a chiral polymer. The piezoelectric sensor is mounted on the plate member so that a macro direction of tensile stresses generated in the piezoelectric sensor by the plate member pressed from the one principal plane in the bonding region of the piezoelectric sensor and a molecular orientation direction of the chiral polymer intersect each other.

With this structure, the piezoelectric sensor is mounted on the plate member, so that the tensile stresses are generated in the piezoelectric sensor by deforming of the plate member pressed from the one principal plane. The piezoelectric sensor is mounted so that the dominant direction from among various directions in which the tensile stresses are generated in the piezoelectric sensor, that is, the macro direction, and the molecular orientation direction of the chiral polymer intersect each other, whereby the amount of electric charge generated in the piezoelectric film can be detected.

In the displacement detection sensor of the present invention, the chiral polymer forming the piezoelectric film is polylactic acid which is at least uniaxially stretched, an angle at which the macro direction of the tensile stresses and the molecular orientation direction intersect each other being preferably approximately 45°.

With this structure, the amount of electric charge generated in the piezoelectric film can be increased. Thus, the sensitivity of the piezoelectric sensor with respect to pressing onto the operation surface can be high.

In the displacement detection sensor of the present invention, the piezoelectric sensor includes a plurality of the piezoelectric sensors, and the plurality of the piezoelectric sensors may be mounted in different positions on the plate member.

With this structure, voltages outputted from the piezoelectric sensors are added without being canceled out, so that the amplitude level of a detection signal with respect to pressing can be increased. Thus, the sensitivity of the piezoelectric sensors with respect to pressing onto the operation surface can be higher.

In the displacement detection sensor of the present invention, the plurality of the piezoelectric sensors is formed on a shared piezoelectric film, and the piezoelectric sensors may have detection electrodes having different outputs.

With this structure, the plurality of the piezoelectric sensors can be formed of the single piezoelectric film. Thus, the displacement sensor can be of a simple structure and be easily manufactured.

In the displacement detection sensor of the present invention, the shared piezoelectric film may be arranged on substantially the entirety of the other principal plane of the operation surface.

With this structure, the piezoelectric film is bonded to the entire face, so that although the entire operation surface is visible from outside, the color is uniform in its entirety, whereby the appearance is good.

In the displacement detection sensor of the present invention, the polylactic acid preferably mainly contains poly-L-lactic acid.

With this structure, the sensitivity with respect to displacement of the plate member, that is, the sensitivity with respect to pressing onto the operation surface, can be higher.

The displacement detection sensor of the present invention preferably has the following structure. The length in a first direction of the plate member is longer than the length in a second direction of the plate member orthogonal to the first direction. The length in the first direction of the piezoelectric sensor is shorter than the length in the second direction of the piezoelectric sensor. The piezoelectric sensor is mounted at the corner of the plate member.

With this structure, the more preferable aspects of the plate member and the piezoelectric sensor are shown. The length in the first direction of the piezoelectric sensor is shorter than the length in the second direction of the piezoelectric sensor, so that tensile stresses are easily generated in the length in the first direction. In addition, the corner of the plate member has a small degree of change in the macro direction of the tensile stresses according to pressing position, and the piezoelectric sensor is mounted at the corner of the plate member so that the length in the first direction thereof is along the first or second direction of the plate member, whereby pressing onto the operation surface can be effectively detected.

An operation input device of the present invention includes the displacement detection sensor according to one of the aspects, and a displacement detection unit detecting displacement from a voltage outputted from the displacement detection sensor.

With this structure, the displacement detection sensor is used, so that the operation input device can have high operation input detection sensitivity.

The operation input device of the present invention preferably has the following structure. The operation input device includes a housing in which the center of the one principal plane of the plate member is opened and to which the peripheral portions of the one principal plane are abutted. The piezoelectric sensor is arranged in the region in which the plate member and the housing are overlapped with each other in the direction orthogonal to the operation surface.

With this structure, the region in which the piezoelectric sensor is mounted is hidden in the housing. Thus, the color of the operation surface opened to outside is uniform in its entirety.

According to the present invention, the displacement detection sensor and the operation input device can have high pressing detection sensitivity.

DETAILED DESCRIPTION OF THE EXEMPLARY EMBODIMENTS

Figure 1:
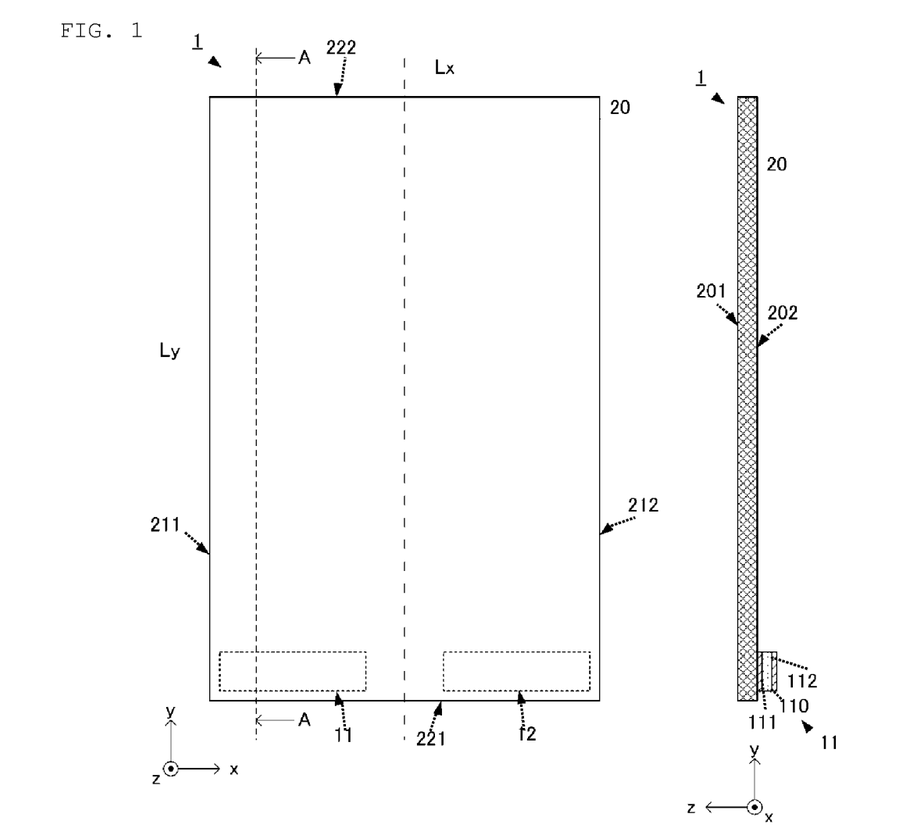
FIG. 1 illustrates a plan view and a side sectional view of a displacement detection sensor according to a first embodiment of the present invention.
Figure 2:
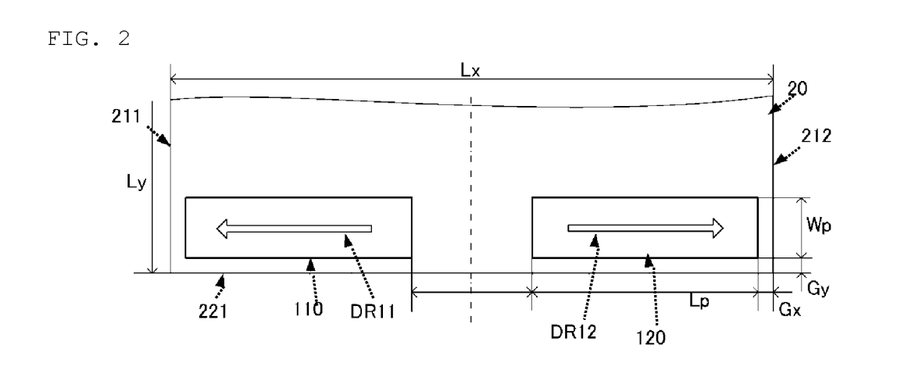
FIG. 2 is a partial enlarged view of the region in which piezoelectric sensors are mounted in the displacement detection sensor according to the first embodiment of the present invention.

A displacement detection sensor and an operation input device according to a first embodiment of the present invention will be described with reference to the drawings. FIG. 1 illustrates a plan view and a side sectional view of the displacement detection sensor according to the first embodiment of the present invention. FIG. 1 is a cross-sectional view taken along line A-A illustrated in the front view. FIG. 2 is a partial enlarged view of the region in which piezoelectric sensors are mounted in the displacement detection sensor according to the first embodiment of the present invention.

A displacement detection sensor 1 has piezoelectric sensors 11 and 12, and a plate member 20. The piezoelectric sensors 11 and 12 have the same structure. Therefore, only the structure of the piezoelectric sensor 11 will be specifically described.

The piezoelectric sensor 11 has a piezoelectric film 110, and detection electrodes 111 and 112. The piezoelectric film 110 is made of polylactic acid (PLA), more specifically, poly-L-lactic acid (PLLA), and is a long plate, width Wp being shorter than length Lp. Molecular orientation direction DR11 of the piezoelectric film 110 coincides with the direction along length Lp of the piezoelectric film 110 (the length direction of the piezoelectric film). In other words, the uniaxial stretching direction of the piezoelectric film 110 coincides with the length direction of the piezoelectric film.

Here, the characteristic of PLLA forming the piezoelectric film 110 will be described.

PLLA includes a chiral polymer. PLLA has a main chain of a helical structure. PLLA has piezoelectric properties by molecular orientation in the direction in which PLLA is uniaxially stretched. Uniaxially stretched PLLA generates electric charge by pressing the planar face of the piezoelectric film. The amount of electric charge generated is uniquely determined according to the amount of displacement in which the planar face is displaced in the direction orthogonal to the planar face by pressing. Uniaxially stretched PLLA has a very high piezoelectric constant as compared with other polymers. Thus, displacement due to pressing can be detected at high sensitivity.

The stretching magnification is preferably approximately 3 to 8 times. Thermal treatment after stretching promotes crystallization of the extended chain crystal of polylactic acid, thereby improving the piezoelectric constant. Biaxial stretching can obtain the same effect as uniaxial stretching by making the stretching magnifications of the respective axes different. For instance, biaxial stretching eight times in an X-axis direction and two times in a Y-axis direction orthogonal to the X-axis direction can have almost the same piezoelectric constant as uniaxial stretching four times in the X-axis direction. Since a film which is simply uniaxially stretched is likely to be torn along the stretching axis direction, such biaxial stretching is performed for improving the strength to some extent.

PLLA exhibits piezoelectric properties in the molecular orientation process by stretching, and is not required to be subjected to a poling process, unlike other polymers, such as PVDF, and piezoelectric ceramics. That is, the piezoelectric properties of PLLA which is not a ferroelectric substance are not exhibited by ionic polarization, unlike other ferroelectric substances, such as PVDF and PZT, but are exhibited by the helical structure which is a molecular characteristic structure. Thus, PLLA exhibits no pyroelectric properties exhibited by other ferroelectric piezoelectric substances. Further, the piezoelectric constant of PVDF is changed with time, and in some cases, can be significantly lowered, whereas the piezoelectric constant of PLLA is very stable with time. Thus, displacement due to pressing can be detected at high sensitivity without being affected by the ambient environment.

PLLA has a very low relative permittivity which is approximately 2.5, and has a large piezoelectric output constant (=piezoelectric g constant, $g=d/\varepsilon T$ where d is a piezoelectric constant, and $\varepsilon T$ is a dielectric constant). Here, from the above equation, the piezoelectric g constant of PVDF in which dielectric constant $\varepsilon 33T=13\times\varepsilon 0$ and piezoelectric constant $d31=25$ pC/N is $g31=0.2172$ Vm/N. Meanwhile, the piezoelectric g constant of PLLA in which piezoelectric constant $d14=10$ pC/N is converted to $g31$, and from $d14=2\times d31$, $d31=5$ pC/N, so that the piezoelectric g constant of PLLA is $g31=0.2258$ Vm/N. Thus, PLLA in which piezoelectric constant $d14=10$ pC/N can sufficiently obtain the same pressing amount detection sensitivity as PVDF. The present inventors have experimentally obtained PLLA in which $d14=15$ to 20 pC/N, which can detect pressing at very high sensitivity.

The detection electrode 111 is formed on substantially the entirety of one planar face (principal plane) of the piezoelectric film 110. The detection electrode 112 is formed on substantially the entirety of the other planar face (principal plane) of the piezoelectric film 110. As the detection electrodes 111 and 112, it is preferable to use either of an organic electrode mainly containing polythiophene and polyaniline, or an inorganic electrode, such as ITO, ZnO, silver nanowire, carbon nanotube, and graphene. By using these materials, the conductor pattern can have high light transmittance.

With the above structure, the piezoelectric sensors can be thin, and have high pressing displacement detection sensitivity and high light transmittance.

The plate member 20 is rectangular to have length Ly in one direction (y direction) and length Lx in the other direction (x direction), which are orthogonal to each other, and has a predetermined thickness. The plate member 20 is made of a material, such as a glass plate, having a certain level of rigidity. The plate member 20 has one principal plane 201, and the other principal plane 202. The plate member 20 has an edge side 211 at one end in the direction of length Lx, and an edge side 212 at the other end in the direction of length Lx. The plate member 20 has an edge side 221 at one end in the direction of length Ly, and an edge side 222 at the other end in the direction of length Ly.

The piezoelectric sensors 11 and 12 are mounted on the plate member 20 as follows. The piezoelectric sensors 11 and 12 are mounted on the other principal plane 202 of the plate member 20. The piezoelectric sensors 11 and 12 are mounted on the plate member 20 so that the detection electrode on one planar face of each of the piezoelectric sensors 11 and 12 is abutted to the other principal plane 202 of the plate member 20.

The piezoelectric sensors 11 and 12 are mounted on the plate member 20 so that the longer side direction (the direction of length Lp) of the piezoelectric sensors 11 and 12 and the direction of length Lx of the plate member 20 are parallel to each other. In other words, the piezoelectric sensors 11 and 12 are mounted on the plate member 20 so that molecular orientation directions DR11 and DR12 and the direction of length Lx of the plate member 20 are parallel to each other. Orientation direction DR11 of the piezoelectric sensor 11 and orientation direction DR12 of the piezoelectric sensor 12 are opposite to each other.

The piezoelectric sensor 11 is mounted near the corner at which the edge sides 211 and 221 of the plate member 20 intersect each other. The piezoelectric sensor 12 is mounted near the corner at which the edge sides 212 and 221 of the plate member 20 intersect each other.

The displacement detection sensor 1 having such a structure is fixed into the housing of the operation input device, with the one principal plane 201 of the plate member 20 as an operation surface. The four edge sides 211, 212, 221, and 222 of the plate member 20 are fixed so as not to be moved at least in the thickness direction at pressing the operation surface.

In such a state, when the one principal plane 201 of the plate member 20 is pressed, the plate member 20 is displaced from the one principal plane 201 side to the other principal plane 202 side, while the pressing position is a position where the plate member 20 is displaced most due to the constrained edge sides 211, 212, 221, and 222. The entire face except for the edge sides 211, 212, 221, and 222 is displaced.

Figure 3:
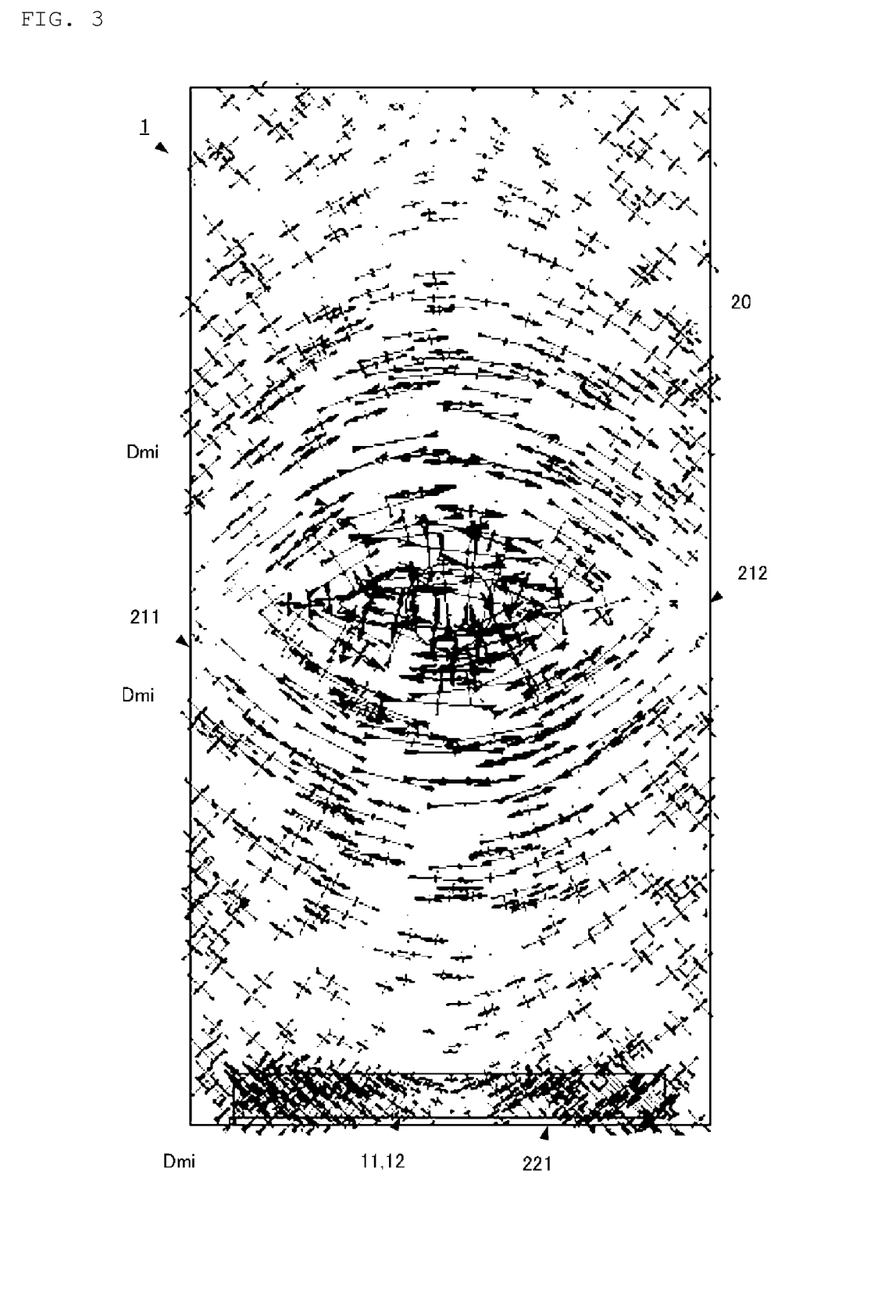
FIG. 3 is a diagram illustrating a displacement distribution in a plate member at pressing the center position of one principal plane thereof.
Figure 4A:
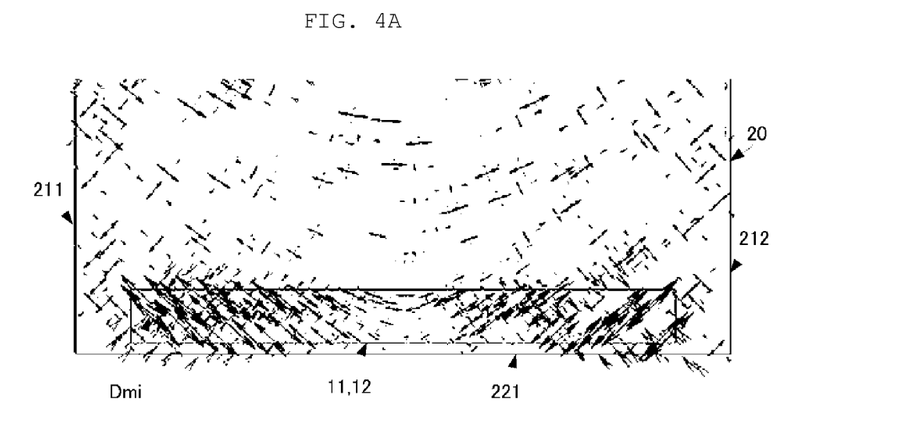
FIGS. 4A and 4B are enlarged views of the displacement distribution illustrated in FIG. 3 in the region of the plate member in which the piezoelectric sensors are mounted.
Figure 4B:
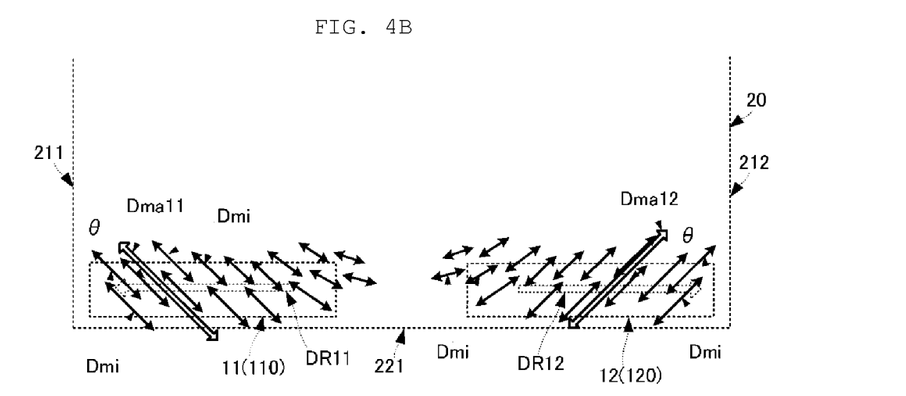

FIG. 3 is a diagram illustrating a displacement distribution in the plate member at pressing the center position of the one principal plane of the plate member. FIGS. 4A and 4B are enlarged views of the displacement distribution illustrated in FIG. 3 in the region of the plate member in which the piezoelectric sensors are mounted.

As illustrated in FIG. 3, tensile stresses, as indicated by the thin double-headed arrows in FIGS. 3, 4A, and 4B, are generated in the entire face of the plate member 20 at pressing the one principal plane 201. Micro tensile stresses Dmi having different magnitudes are generated in the local positions of the plate member 20. That is, micro tensile stresses Dmi having magnitudes according to pressing amount are distributed in the respective positions over the entire face of the plate member 20.

Here, as illustrated in FIGS. 3, 4A, and 4B, the magnitude of micro tensile stresses Dmi is large in the region near the corner of the plate member 20 at which the edge sides 211 and 221 intersect each other and in the region near the corner of the plate member 20 at which the edge sides 212 and 221 intersect each other.

In the region near the corner of the plate member 20 at which the edge sides 211 and 221 intersect each other, an angle at which the direction of micro tensile stresses Dmi intersects the edge sides 211 and 221 is approximately 45°. Such micro tensile stresses Dmi are large near the corner, and become smaller toward the intermediate position of the edge side 221 and toward the center of the plate member 20, so that the angle of micro tensile stresses Dmi with respect to the edge sides 211 and 221 is also changed.

As described above, in the region near the corner at which the edge sides 211 and 221 intersect each other and in which micro tensile stresses Dmi are distributed, the piezoelectric sensor 11 is mounted so that the longer side direction is along the edge side 221.

Since micro tensile stresses Dmi are distributed as described above, in the region in which the piezoelectric sensor 11 is mounted, micro tensile stresses Dmi are dominantly at 45° with respect to the edge sides 211 and 221. An angle at which macro tensile stress Dma11 which is the total of micro tensile stresses Dmi in the region in which the piezoelectric sensor 11 is mounted intersects the edge sides 211 and 221 is 45°.

With this, angle θ formed by molecular orientation direction DR11 of the piezoelectric film 110 of the piezoelectric sensor 11 and macro tensile stress Dma11 is 45°. PLLA forming the piezoelectric film 110 generates the largest amount of electric charge with respect to the stresses applied in the direction at 45° with respect to molecular orientation direction DR11.

With this structure, the piezoelectric sensor 11 can detect a large amount of electric charge with respect to displacement at pressing the operation surface (the one principal plane 201).

In the region near the corner of the plate member 20 at which the edge sides 212 and 221 intersect each other, an angle at which the direction of micro tensile stresses Dmi intersects the edge sides 212 and 221 is approximately 45°.

The direction of micro tensile stresses Dmi in the region near the corner at which the edge sides 212 and 221 intersect each other is substantially orthogonal to the direction of micro tensile stresses Dmi in the region near the corner at which the edge sides 211 and 221 intersect each other. Such micro tensile stresses Dmi are large near the corner, and become smaller toward the intermediate position of the edge side 221 and toward the center of the plate member 20, so that the angle of micro tensile stresses Dmi with respect to the edge sides 212 and 221 is also changed.

As described above, in the region near the corner at which the edge sides 212 and 221 intersect each other and in which micro tensile stresses Dmi are distributed, the piezoelectric sensor 12 is mounted so that the longer side direction is along the edge side 221.

Since micro tensile stresses Dmi are distributed as described above, in the region in which the piezoelectric sensor 12 is mounted, micro tensile stresses Dmi are dominantly at 45° with respect to the edge sides 212 and 221. Thus, an angle at which macro tensile stress Dma12 which is the total of micro tensile stresses Dmi in the region in which the piezoelectric sensor 12 is mounted intersects the edge sides 212 and 221 is 45°.

With this, angle θ formed by molecular orientation direction DR12 of the piezoelectric film 120 of the piezoelectric sensor 12 and macro tensile stress Dma11 is 45°. PLLA forming the piezoelectric film 120 generates the largest amount of electric charge with respect to the stresses applied in the direction at 45° with respect to molecular orientation direction DR12. With this structure, the piezoelectric sensor 12 can detect a large amount of electric charge with respect to displacement at pressing the operation surface (the one principal plane 201).

As described above, with the structure of this embodiment, the displacement detection sensor can have high sensitivity with respect to pressing onto the operation surface. In addition, the thin piezoelectric sensors 11 and 12 are mounted on the plate member 20, so that the displacement detection sensor can be thin. Further, the plate member 20 and the piezoelectric sensors 11 and 12 have high light transmittance, so that the displacement detection sensor can have high light transmittance.

With the above structure, the two piezoelectric sensors 11 and 12 are mounted on the plate member 20, but only one of the piezoelectric sensors 11 and 12 may be mounted on the plate member 20.

With the above structure, the angle at which molecular orientation direction DR11 of the piezoelectric sensor 11 and macro tensile stress Dma11 intersect each other is 45°, and the angle at which molecular orientation direction DR12 of the piezoelectric sensor 12 and macro tensile stress Dma12 intersect each other is 45°, but even other angles can detect electric charge. However, at 45°, the following advantage can be obtained.

Figure 5A:
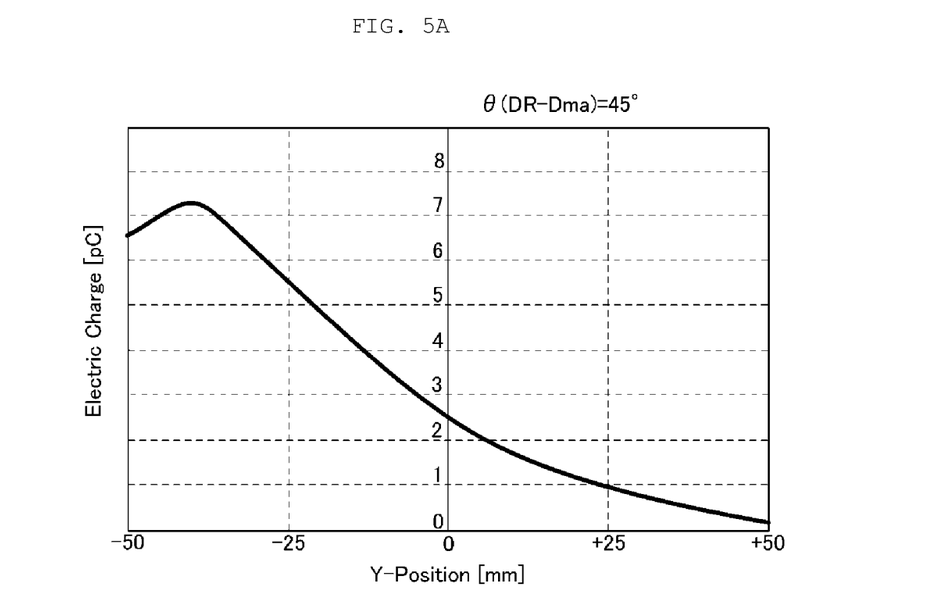
FIGS. 5A and 5B are graphs of the pressing position dependence characteristic of the amount of electric charge generated in the piezoelectric film of each piezoelectric sensor.
Figure 5B:
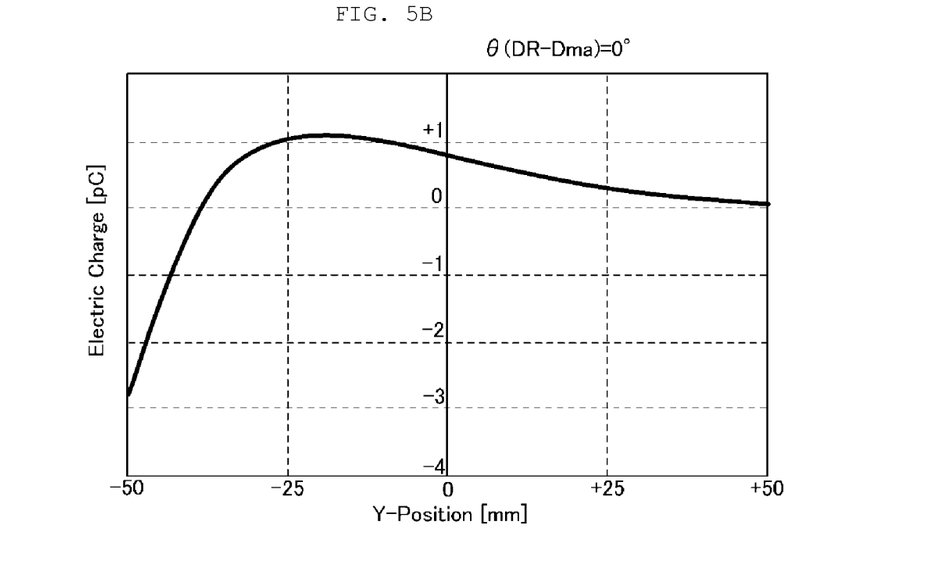

FIGS. 5A and 5B are graphs of the pressing position dependence characteristic of the amount of electric charge generated in the piezoelectric film of each piezoelectric sensor. FIG. 5A illustrates the case of the structure of this embodiment, and FIG. 5B illustrates the case that the molecular orientation direction is different from that of the structure of this embodiment. In FIG. 5B, the molecular orientation direction and the macro tensile stress direction are parallel to each other (intersection angle θ=0°).

As illustrated in FIGS. 5A and 5B, in the case of the structure of this embodiment, that is, in the case that angle θ at which the molecular orientation direction and the macro tensile stress direction intersect each other is 45°, the amount of electric charge generated is large, whereas in the case that angle θ at which the molecular orientation direction and the macro tensile stress direction intersect each other is 0°, the amount of electric charge generated is small, with the result that it is difficult to detect electric charge. This characteristic is not changed even at changing the pressing position in the direction of length Ly (y direction). Further, with the structure of this embodiment, electric charge generated is "+" not depending on the pressing position in the direction of length Ly. In other words, in any pressing position, electric charge which can be outputted to outside at pressing is generated.

In the structure of this embodiment, angle θ at which the molecular orientation direction and the macro tensile stress direction intersect each other is 45°, so that the amount of electric charge detected can be large to improve the pressing detection sensitivity. Further, pressing can be reliably detected without depending on the pressing position.

In this structure, the longer side directions and molecular orientation directions DR11 and DR12 of the piezoelectric films 110 and 120 are parallel to each other, respectively. Thus, it is easy to cut out the piezoelectric films 110 and 120 from a piezoelectric sheet which is a raw material in which the uniaxial stretching direction and each edge side are typically parallel or orthogonal to each other. In addition, there can be no regions in which the piezoelectric films 110 and 120 at the corners of the raw material cannot be taken because the uniaxial stretching direction and each end piece are not parallel or orthogonal to each other, so that the piezoelectric films 110 and 120 can thus be efficiently cut out from the raw piezoelectric sheet.

Figure 6:
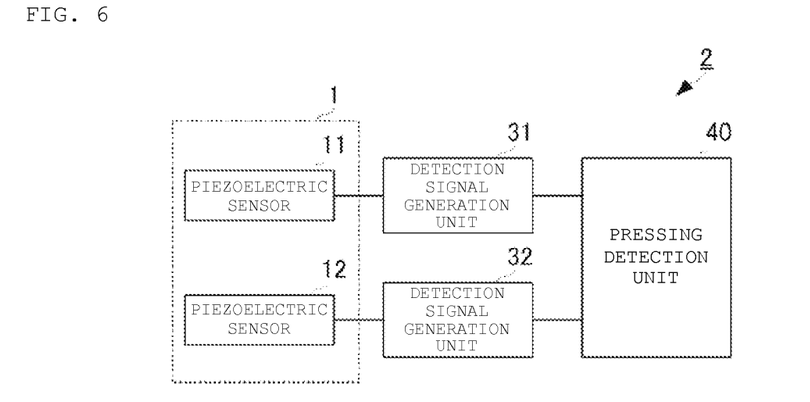
FIG. 6 is a circuit block diagram of an operation input device according to the first embodiment of the present invention.

An operation input device 2 can have the displacement detection sensor 1 of the above embodiment, and the following circuit structure. FIG. 6 is a circuit block diagram of the operation input device according to this embodiment.

The operation input device 2 has the displacement detection sensor 1 having the piezoelectric sensors 11 and 12, detection signal generation units 31 and 32, and a pressing detection unit 40. The piezoelectric sensor 11 is connected to the detection signal generation unit 31, and the piezoelectric sensor 12 is connected to the detection signal generation unit 32. The detection signal generation units 31 and 32 are connected to the pressing detection unit 40.

The detection signal generation unit 31 generates a first detection signal based on the output voltage of the piezoelectric sensor 11, and outputs the first detection signal to the pressing amount detection unit 40. The detection signal generation unit 32 generates a second detection signal based on the output voltage of the piezoelectric sensor 12, and outputs the second detection signal to the pressing amount detection unit 40. The pressing amount detection unit 40 adds the first and second detection signals, and detects the pressing amount from the addition result. In addition, the pressing amount detection unit 40 can set a threshold value with respect to the addition result, detect that the addition result exceeds the threshold value, and detect that pressing onto the operation surface is performed, that is, that operation input is performed.

The operation input device 2 of such a structure which has the displacement detection sensor 1 can have high operation input detection sensitivity. In addition, the pressing amount detection sensitivity can be high.

Figure 7:
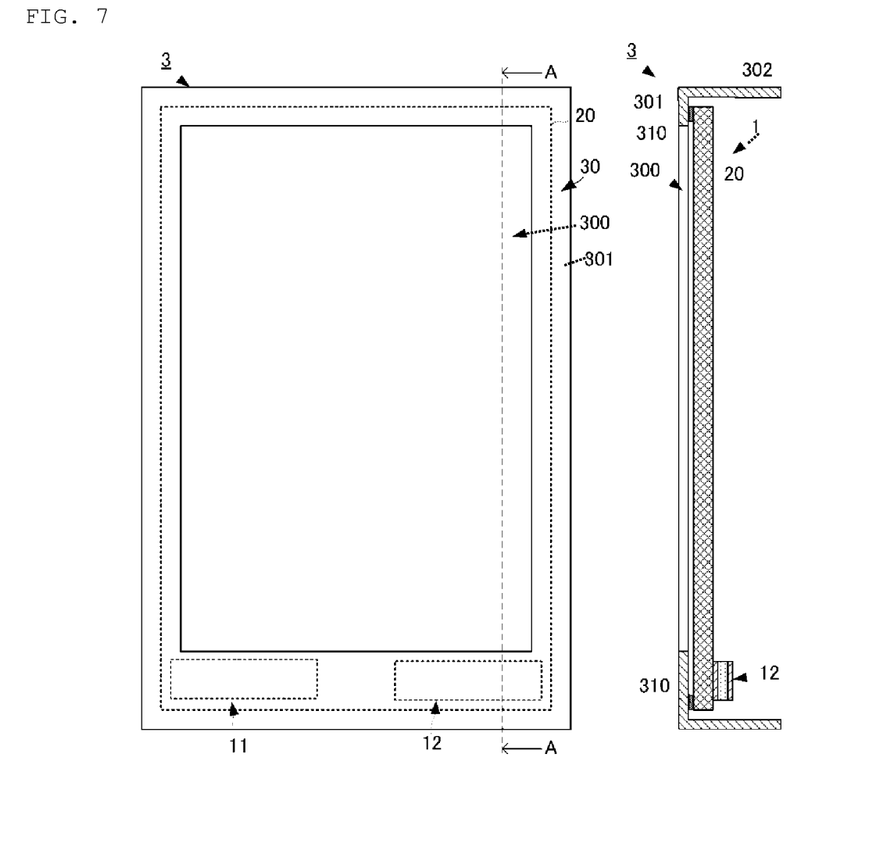
FIG. 7 illustrates a front view and a side sectional view of the operation input device according to the first embodiment of the present invention.

The displacement detection sensor 1 is mounted in the operation input device 2 by the structure illustrated in FIG. 7. FIG. 7 illustrates a front view and a side sectional view of the operation input device according to this embodiment. The operation input device 2 has the displacement detection sensor 1, and a housing 30. In the drawing, only a front wall 301 and a side wall 302 of the housing 30 are illustrated, but the housing 30 also has a bottom wall, not illustrated. In addition, other circuit components of the operation input device 2, not illustrated, are incorporated in the housing 30.

The housing 30 has the front wall 301, and the side wall 302. The front wall 301 is a plate having predetermined rigidity, and has a through-hole in the thickness direction by leaving the peripheral portions having a predetermined width near the edge sides. The through-hole is an opening 300. The opening 30 is rectangular, and is opened at lengths shorter than lengths Lx and Ly of the plate member 20 in the directions of lengths Lx and Ly of the plate member 20.

The side wall 302 extends in the direction orthogonal to the planar face of the front wall 301. The side wall 302 is continuous along the outer periphery of the front wall 301.

The plate member 20 is mounted in the housing 30 so that the one principal plane 201 is abutted to the inner face side of the front wall 301. The plate member 20 is mounted over the inner wall of the front wall 301 by adhesives 310. Each adhesive 310 is preferably a material which has high rigidity after bonding and prevents the edge sides 211, 212, 221, and 222 of the plate member 20 from being displaced to the inner side of the housing 30 at pressing the plate member 20. The plate member 20 may be mechanistically fixed by a screw without using the adhesive 310.

In this embodiment, in a state in which the displacement detection sensor 1 is mounted in the housing 30, the mounting regions of the piezoelectric sensors 11 and 12 on the plate member 20 are not overlapped with the opening 300. In other words, the displacement detection sensor 1 is mounted in the housing 30 so that the mounting regions of the front wall 301 of the housing 30 and the piezoelectric sensors 11 and 12 are overlapped with each other.

With such a structure, in the operation surface, that is, in the operation region, of the displacement detection sensor 1, only the plate member 20 is visible from the opening 300, so that the color is uniform in its entirety. Thus, the operation input device whose operation surface can have good appearance, while maintaining high operation input detection sensitivity.

Figure 8:
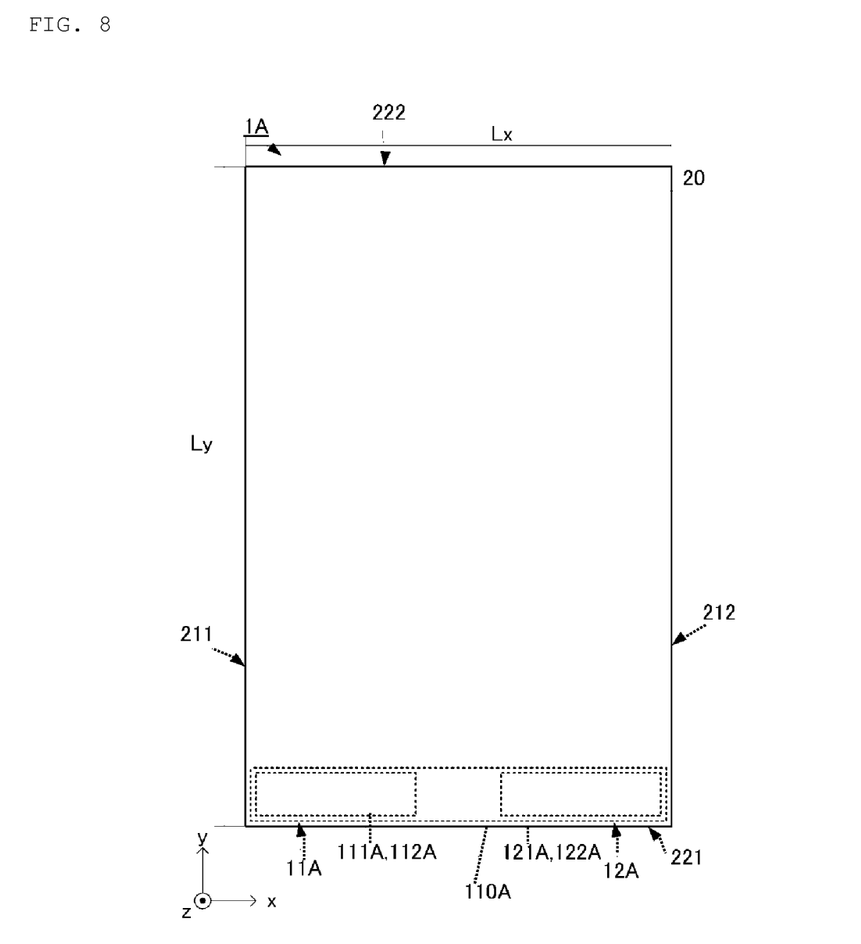
FIG. 8 is a plan view of a displacement detection sensor according to a second embodiment of the present invention.

A displacement detection sensor according to a second embodiment will be described with reference to the drawing. FIG. 8 is a plan view of the displacement detection sensor according to the second embodiment of the present invention.

A displacement detection sensor 1A of this embodiment is the same as the displacement detection sensor 1 of the first embodiment except that a piezoelectric film 110A is shared between piezoelectric sensors 11A and 12A. The points different from the displacement detection sensor 1 of the first embodiment will be specifically described.

Specifically, the piezoelectric film 110A is long so that the longer side direction and molecular orientation direction DR11A are parallel to each other. The piezoelectric film 110A is arranged near the edge side 221 of the plate member 20 so that the edge side 221 and the longer side direction are parallel to each other. The piezoelectric film 110A extends along substantially overall length Lx of the plate member 20.

Detection electrodes 111A and 112A sandwich the piezoelectric film 110A therebetween over the predetermined length on the edge side 211 side. The region sandwiched between the detection electrodes 111A and 112A becomes the piezoelectric sensor 11A.

Detection electrodes 121A and 122A sandwich the piezoelectric film 110A therebetween over the predetermined length on the edge side 212 side. The region sandwiched between the detection electrodes 111A and 112A becomes the piezoelectric sensor 12A.

With such a structure, an angle formed by molecular orientation direction DR11A of the piezoelectric film 110A of the piezoelectric sensors 11A and 12A and the macro tensile stress direction in the forming regions of the piezoelectric sensors 11A and 12A is 45°. Thus, like the above embodiment, the displacement detection sensor can have high sensitivity with respect to pressing onto the operation surface.

In this embodiment, a detection signal from the piezoelectric sensor 11A and a detection signal from the piezoelectric sensor 12A are opposite in phase. These detection signals are synthesized in differentiating manner to increase the amplitude of the synthesized detection signal, so that the detection sensitivity can be further improved.

Figure 9:
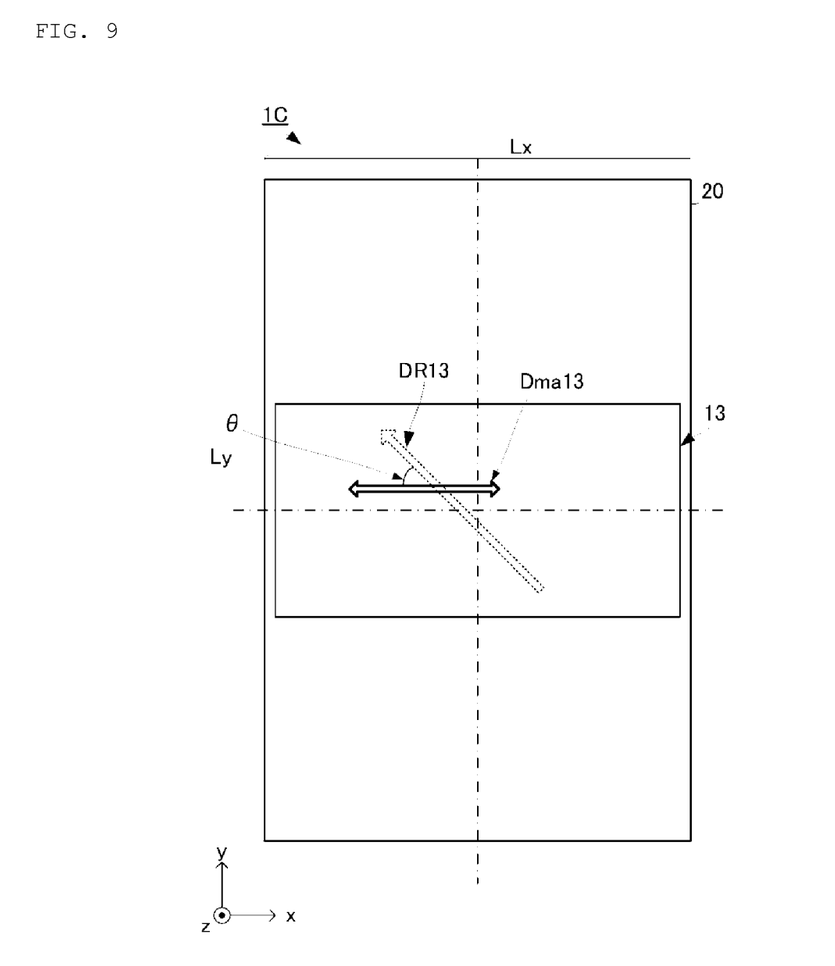
FIG. 9 is a plan view of a displacement detection sensor according to a third embodiment of the present invention.

A displacement detection sensor according to a third embodiment will be described with reference to the drawing. FIG. 9 is a plan view of the displacement detection sensor according to the third embodiment of the present invention.

A displacement detection sensor 1B of this embodiment is the same as the displacement detection sensor 1 of the first embodiment except that the shape of a piezoelectric sensor 13 and the bonding position thereof onto the plate member 20 are different. Only the points different from the displacement detection sensor 1 of the first embodiment will be specifically described.

A displacement detection sensor 1C has the piezoelectric sensor 13. The piezoelectric sensor 13 has detection electrodes formed on both principal planes of the piezoelectric film. The piezoelectric sensor 13 is mounted on the plate member 20 so that an angle at which molecular orientation direction DR13 of the piezoelectric film and the direction of length Lx and the direction of length Ly of the plate member 20 intersect each other is 45°. The piezoelectric sensor 13 is mounted in the substantially center region of the plate member 20, viewed from the front, and extends along substantially overall length Lx of the plate member 20.

With such a structure, as illustrated in FIG. 3, in the mounting region of the piezoelectric sensor 13, micro tensile stresses are dominant in the direction of length Lx.

With this, in the mounting region of the piezoelectric sensor 13, the direction of macro tensile stress Dma13 is the direction of length Lx. Thus, angle θ at which the direction of macro tensile stress Dma13 and molecular orientation direction DR13 of the piezoelectric film of the piezoelectric sensor 13 intersect each other is 45°. Thus, the piezoelectric sensor 13 can detect displacement at pressing the operation surface of the plate member 20 at high sensitivity.

In the above embodiments, only a few examples of the relation between the mounting region of the piezoelectric sensor and the molecular orientation direction of the piezoelectric sensor are given as the features of the present invention, and under the following conditions, even when the piezoelectric sensor is bonded in any position of the plate member, displacement detection can be made at relatively high sensitivity, with varying degrees of sensitivity. When the macro tensile stress direction in the entire face of the plate member 20 is determined, the piezoelectric sensor extending over the entire face of the plate member 20 is used so that the molecular orientation direction of the piezoelectric film of the piezoelectric sensor intersects the macro tensile stress direction in the entire face of the plate member 20 at an angle of 45°. When the piezoelectric sensor is mounted on the entire face of the plate member 20, the color of the operation surface is uniform in its entirety, so that the displacement detection sensor can have good appearance.

In the above description, poly-L-lactic acid is given as an example of PLA, but poly-D-lactic acid may be used.

DESCRIPTION OF REFERENCE SYMBOLS 1, 1A, 1B Displacement detection sensor
2 Operation input device
11, 12 Piezoelectric sensor
31, 32 Detection signal generation unit
40 Pressing detection unit
110, 110A, 120 Piezoelectric film
111, 112 etection electrode
20 Plate member
30 Housing
300 Opening
310 Front wall
302 Side wall
201 One principal plane
202 The other principal plane
211, 212, 221, 222 Edge side
110 Piezoelectric film
111, 112 Detection electrode

The invention claimed is:

1. A displacement detection sensor comprising:
a plate member having a first principal plane and a second principal plane opposite the first principal plane; and
a flat-film piezoelectric sensor disposed on the second principal plane of the plate member and including a flat piezoelectric film and a pair of detection electrodes disposed on respective principal planes of the piezoelectric film,
wherein each of the plate member and the flat-film piezoelectric sensor comprises a pair of opposing longer sides and a pair of opposing short sides,
wherein the longer sides of the flat-film piezoelectric sensor extend in a same direction as the shorter sides of the plate member,
wherein the piezoelectric film comprises a chiral polymer having a molecular orientation direction that extends in a direction parallel to the longer sides of the flat-film piezoelectric sensor, and
wherein the piezoelectric sensor is disposed at a position on the second principal plane of the plate member such that a macro direction of tensile stresses generated in the piezoelectric sensor when the first principal plane of the plate member is pressed intersects the molecular orientation direction of the chiral polymer.

2. The displacement detection sensor according to claim 1, wherein the chiral polymer is polylactic acid that is at least uniaxially stretched.

3. The displacement detection sensor according to claim 2, wherein the macro direction of the tensile stresses and the molecular orientation direction intersect at an angle of approximately 45°.

4. The displacement detection sensor according to claim 1, wherein the piezoelectric sensor includes a plurality of the piezoelectric sensors that are disposed in different positions on the first principal plane of the plate member.

5. The displacement detection sensor according to claim 4, wherein the plurality of the piezoelectric sensors each comprises a chiral polymer having a molecular orientation direction opposite from each other and that extends in the direction parallel to the longer sides of the flat-film piezoelectric sensor.

6. The displacement detection sensor according to claim 4, wherein the plurality of the piezoelectric sensors are disposed on a shared piezoelectric film and each of the piezoelectric sensors have detection electrodes with different outputs.

7. The displacement detection sensor according to claim 6, wherein the shared piezoelectric film is disposed on substantially an entirety of the second principal plane of the plate member.

8. The displacement detection sensor according to claim 1, wherein the polylactic acid comprises mainly contains poly-L-lactic acid.

9. A displacement detection sensor comprising:
a plate member having a first principal plane and a second principal plane opposite the first principal plane; and
a flat-film piezoelectric sensor disposed on the second principal plane of the plate member and including a flat piezoelectric film and a pair of detection electrodes disposed on respective principal planes of the piezoelectric film,
wherein the piezoelectric film comprises a chiral polymer,
wherein the plate member is rectangular shaped with a length in a first direction longer than a length in a second direction that is orthogonal to the first direction,
wherein the piezoelectric sensor is rectangular shaped with a length in the first direction that is shorter than a length in the second direction,
wherein the piezoelectric sensor is disposed at a corner of the plate member such that the length in the first direction of the piezoelectric sensor extends in the first direction of the plate member, and
wherein the chiral polymer has a molecular orientation direction that extends in a direction parallel to the length of the piezoelectric sensor that extends in the second direction.

10. The displacement detection sensor according to claim 9, wherein the chiral polymer is polylactic acid that is at least uniaxially stretched.

11. The displacement detection sensor according to claim 9, wherein the piezoelectric sensor includes a plurality of the piezoelectric sensors that are disposed in different positions on the first principal plane of the plate member.

12. The displacement detection sensor according to claim 11, wherein the plurality of the piezoelectric sensors each comprises a chiral polymer having a molecular orientation direction opposite from each other and that extends in the direction parallel to the longer sides of the flat-film piezoelectric sensor.

13. The displacement detection sensor according to claim 12, wherein the plurality of the piezoelectric sensors are disposed on a shared piezoelectric film and each of the piezoelectric sensors have detection electrodes with different outputs.

14. The displacement detection sensor according to claim 13, wherein the shared piezoelectric film is disposed on substantially an entirety of the second principal plane of the plate member.

15. The displacement detection sensor according to claim 9, wherein the polylactic acid comprises mainly contains poly-L-lactic acid.

16. An operation input device comprising:
a displacement detection sensor comprising:
a plate member having a first principal plane and a second principal plane opposite the first principal plane; and
a flat-film piezoelectric sensor disposed on the second principal plane of the plate member and including a flat piezoelectric film and a pair of detection electrodes disposed on respective principal planes of the piezoelectric film,
wherein each of the plate member and the flat-film piezoelectric sensor comprises a pair of opposing longer sides and a pair of opposing short sides,
wherein the longer sides of the flat-film piezoelectric sensor extend in a same direction as the shorter sides of the plate member,
wherein the piezoelectric film comprises a chiral polymer having a molecular orientation direction that extends in a direction parallel to the longer sides of the flat-film piezoelectric sensor, and
wherein the piezoelectric sensor is disposed at a position on the second principal plane of the plate member such that a macro direction of tensile stresses generated in the piezoelectric sensor when the first principal plane of the plate member is pressed intersects the molecular orientation direction of the chiral polymer; and
a displacement detection unit configured to detect displacement from a voltage outputted from the displacement detection sensor.

17. The operation input device according to claim 16, further comprising a housing in which the first principal plane of the plate member comprises an opening and peripheral portions of the first principal plane are abutted,
wherein the piezoelectric sensor is disposed in a region where the plate member and the housing overlap in a direction orthogonal to the first principal plane.

18. The operation input device according to claim 16, wherein the chiral polymer is polylactic acid that is at least uniaxially stretched.

19. The operation input device according to claim 18, wherein the macro direction of the tensile stresses and the molecular orientation direction intersect at an angle of approximately 45°.

20. The operation input device according to claim 16, wherein the piezoelectric sensor includes a plurality of the piezoelectric sensors that are disposed in different positions on the first principal plane of the plate member.

* * * * *